(12) United States Patent
Wickman et al.

(10) Patent No.: US 6,845,211 B2
(45) Date of Patent: Jan. 18, 2005

(54) METHOD OF ATTENUATING AN OPTICAL SIGNAL

(75) Inventors: Randy W. Wickman, Cadott, WI (US); Thomas Brockman, St. Charles, MN (US); Steven C. Nelson, Fall Creek, WI (US)

(73) Assignee: Corona Optical Systems, Inc., Lombard, IL (US)

( * ) Notice: Subject to any disclaimer, the term of this patent is extended or adjusted under 35 U.S.C. 154(b) by 19 days.

(21) Appl. No.: 10/235,750

(22) Filed: Sep. 5, 2002

(65) Prior Publication Data
US 2003/0044157 A1 Mar. 6, 2003

Related U.S. Application Data
(60) Provisional application No. 60/317,138, filed on Sep. 6, 2001.

(51) Int. Cl.[7] .............................. G02B 6/26; G02B 6/42
(52) U.S. Cl. ......................................... 385/140; 385/88
(58) Field of Search ........................... 385/140, 88, 411, 385/80; 427/162, 164, 165; 156/99, 60; 438/106, 108, 118, 119

(56) References Cited

U.S. PATENT DOCUMENTS

| | | | | | |
|---|---|---|---|---|---|
| 5,032,718 A | * | 7/1991 | Murakami | ............... | 250/227.2 |
| 5,990,498 A | * | 11/1999 | Chapnik et al. | ............... | 257/99 |
| 6,257,772 B1 | * | 7/2001 | Nakanishi et al. | ............ | 385/89 |
| 6,404,970 B1 | * | 6/2002 | Gransden et al. | ........... | 385/140 |
| 6,579,398 B1 | * | 6/2003 | Ogawa | ........................ | 156/230 |

* cited by examiner

*Primary Examiner*—Brian Healy
*Assistant Examiner*—James P. Hughes
(74) *Attorney, Agent, or Firm*—Welsh & Katz, Ltd.

(57) ABSTRACT

A method and apparatus are provided for transmitting an optical communications signal. The method includes the steps of securing an optical device onto an optically transparent substrate with an optically transparent adhesive such that an axis of transmission of the optical device passes directly through the optically transparent adhesive and a portion of the body of the optically transparent substrate, darkening a portion of the optically transparent adhesive with a laser; and transmitting light from the optical device through the darkened portion of the optically transparent adhesive such that at least some of the light from the optical device is absorbed by the darkened portion.

12 Claims, 4 Drawing Sheets

METHOD OF ATTENUATING AN OPTICAL SIGNAL

FIELD OF THE INVENTION

The present invention relates to optical communication devices, and more specifically to the structure of optoelectronic couplers.

BACKGROUND OF THE INVENTION

This application claims the benefit of U.S. Provisional Patent Application No. 60/317,138, filed on Sep. 6, 2001.

Traditionally, VCSEL dies are vertically mounted to a printed circuit board, or PCB, with light emitting from the same surface as the electrical contacts. The PCB is usually made of FR4 or ceramic. As shown in the prior art of FIG. 1, a TO can 12 has wire bonds 16 used in electrically connecting the VCSEL die 14. Wire bonds 16 are more susceptible to damage than solder bumps, and are generally avoided if possible. In addition, wire bonding is inconsistent in terms of variance in electrical properties. As the wire lengths vary, the resistance, inductance and capacitance also varies.

As shown in FIG. 1, the TO can's base comprises a header 20 and a conductive spacer 18. A metallic structure 22, referred to as a can, provides a hermetic seal for a VCSEL laser array 14. Optical signals 26 exit the TO can 10 through a lens 24, and may be appropriately coupled into a waveguide (not shown). Lensing mechanisms are often needed to couple light as desired into a waveguide or optical fiber. For example, a VCSEL laser die contains electrical contacts on the same surface of light emission, and wire bonding to that surface will increase the minimum distance from the active surface of the laser to the optical fiber. As a result, the signal may require lensing to gather diverging light.

A method of attaching the VCSEL die using metal to metal contacts on the pads such as solder bumps or stud bumps can make closer connections that are more consistent in electrical variance and offer greater structural stability than wire bonds. This method of attaching is commonly referred to as flip chipping. Wire bonding will add to the overall height in the package more so than flip chipping, as shown in FIG. 1. In addition, flip chipping allows for a waveguide and/or lens structure to be placed closer to the surface of light emission. Thus, more light could be gathered from an optical port into a waveguide or optical fiber. This in turn may preserve signal integrity. In this invention is provided a novel way to couple light from an optical device, into a waveguide, and subsequently into an optical fiber. The invention may allow coupling of a more uniform optical beam profile while transmitting an appropriate optical energy amount to a receiving device. In addition, the invention may promote signal integrity.

SUMMARY OF THE INVENTION

A method and apparatus are provided for transmitting an optical communications signal. The method includes the steps of securing an optical device onto an optically transparent substrate with an optically transparent adhesive such that an axis of transmission of the optical device passes directly through the optically transparent adhesive and a portion of the body of the optically transparent substrate, darkening a portion of the optically transparent adhesive with a laser; and transmitting light from the optical device through the darkened portion of the optically transparent adhesive such that at least some of the light from the optical device is absorbed by the darkened portion.

When moving a waveguide or optical fiber closer to an optical port of a VCSEL, a more uniform LASER beam profile can be coupled, and the total amount of light gathered will increase. As it is desirable to couple a uniform optical profile, it is not necessarily advantageous to gather as much light as possible. Capturing too much light through an optical fiber or waveguide could cause a few problems, one of which is eye safety. As a laser can cause permanent damage to the human eye, it is imperative to ensure that a laser's output does not come in contact with a human eye in a hazardous manner. To do this, the net amount of light output could be decreased or absorbed in order to promote an eye safe device. That is, enough light output could be decreased or absorbed to maintain signal integrity but promote eye safety.

Another possible consequence in gathering too much light involves the inability of a receiving optical device to process the light energy. A photodetector may provide an electrical output that is proportional to the amount of light energy from a transmitting device. If the input signal to a photodetector contains too much light energy, the photodetector could become saturated. That is, the linear proportionality between the incoming light energy and the outgoing electrical signal could diminish, and the photodetector may not respond accordingly to a certain range of light energy. Additionally, if the photodetector has not already saturated, the signal processor receiving the electrical signal from the photodetector could become saturated. That is, the signal processor's limits will have been reached because the value of the input electrical signal could be too high. Because of these two consequences in gathering too much light energy, it is necessary to appropriately attenuate an optical signal.

DESCRIPTION OF THE INVENTION

Figure 1:
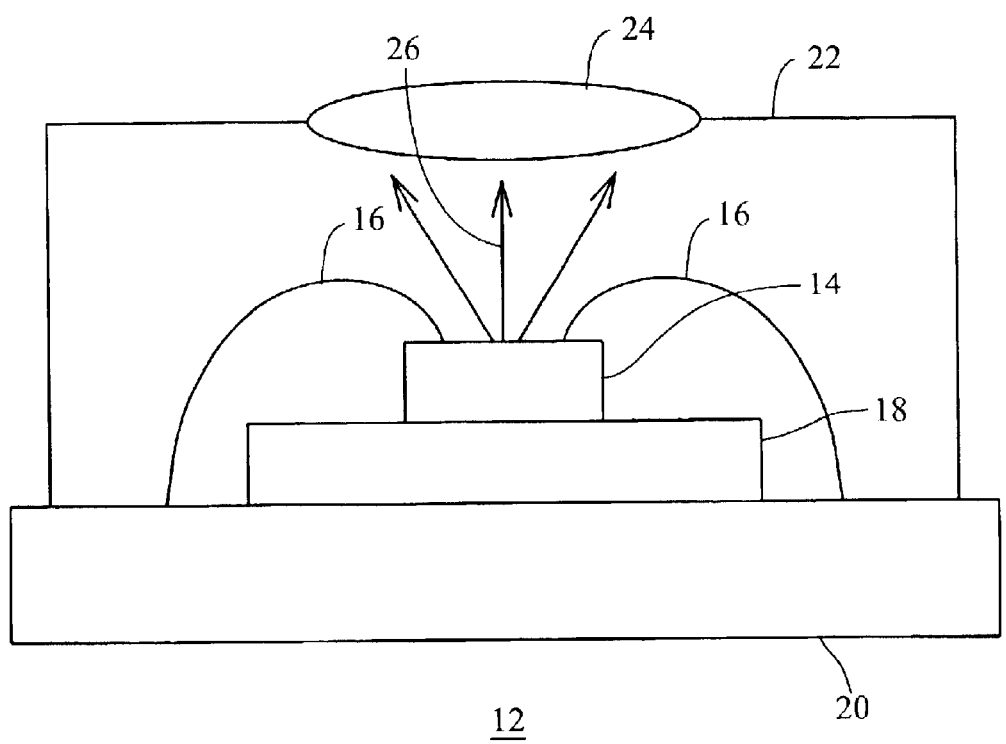
FIG. 1 is a front view of a prior art optical device.
Figure 2:
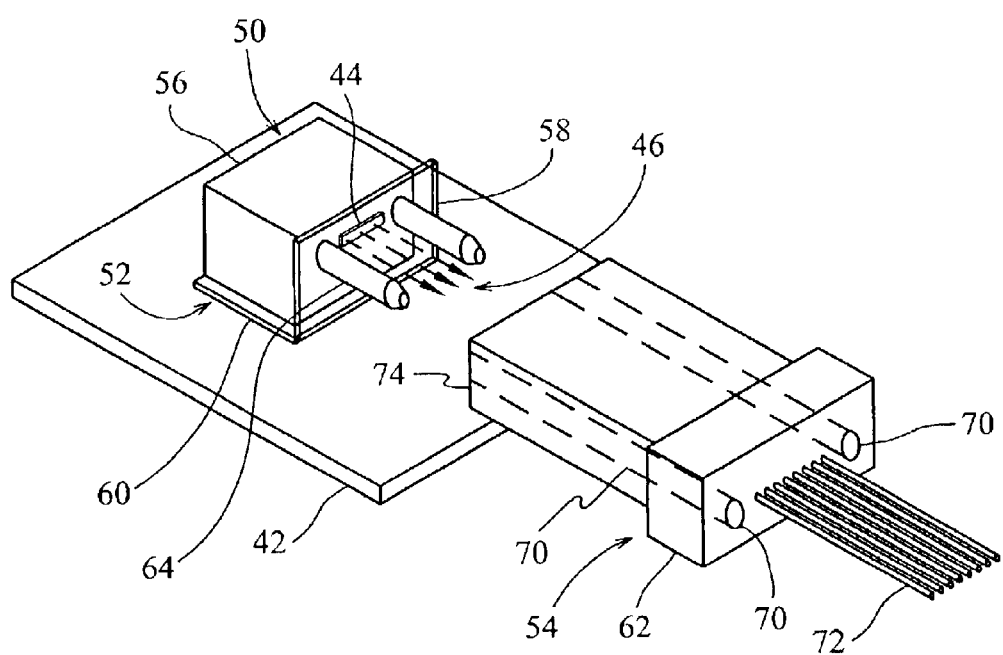
FIG. 2 is a profile view of an electro-optic communications assembly under an illustrated embodiment of the invention.

FIG. 2 shows an electro-optic communications assembly 40 in accordance with the invention and in a context of use. The assembly 40 may include a common substrate 42, or printed circuit board (PCB), an optically transparent substrate assembly 52 attached to the PCB 42, and an optical connector assembly 54 generally holding a plurality of optical fibers 72.

The PCB 42, may be any suitable material such as FR4, ceramic interconnect, or the like. The PCB 42 may have a plurality of electrical and optical devices for signal processing, as well as electrical traces and electrical pads (not shown in the figure).

The optically transparent substrate assembly 52 may comprise a glass or a glass-like structure having desirable optical and structural properties, and could be about 110 microns in thickness. The substrate assembly 52 generally includes first and second optically transparent substrates 58, 60 joined along a common edge and an optical array 44. The optical array 44 may be mechanically and electrically attached to the first substrate 58. The second substrate 60 may be attached to the PCB 42 by a conductive adhesive, solder/stud bumps, or a similar material. As shown in FIG. 2, the planar elements 58, 60 of the substrate assembly 52 may be separated by a right angle bend at an appropriate location to allow planarity of optical signals 46 of the optical array 44 with respect to the PCB 42. Further details of the substrates 58, 60 will be discussed below.

The optical connector assembly 54 may generally comprise a plug 62 holding a plurality of optical fiber ends 72 in alignment with a set of apertures 70 as shown in the figure. In a preferred embodiment of the invention, the fiber holding alignment mechanism 50 could be a standard MT connector, or ferrule, manufactured by US Conec or Nippon Telephone & Telegraph; US Conec Part number MTF-12MM7.

Figure 3:
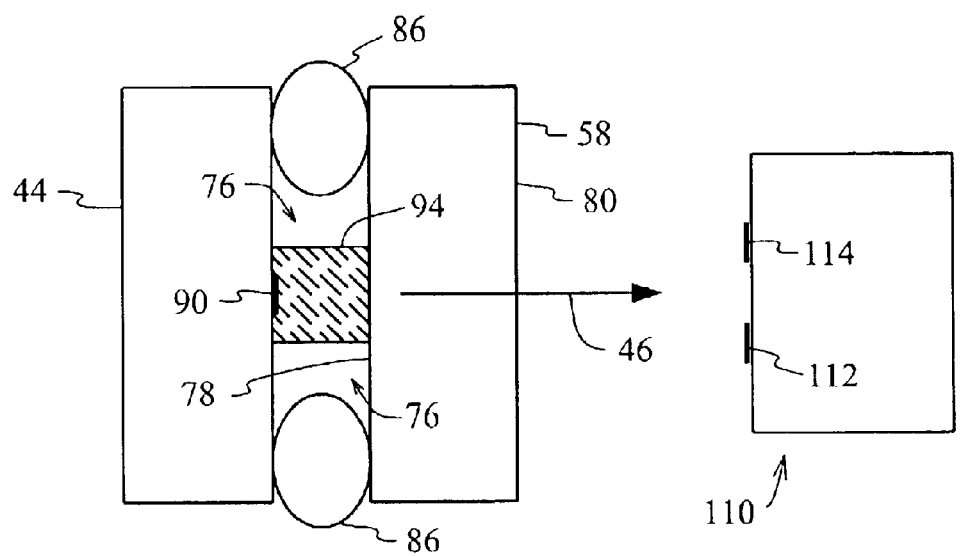
FIG. 3 is a side view of an optical array attached to the optically transparent substrate of FIG. 2.

FIG. 3 illustrates a side view of a portion of the first substrate 58. The substrate 58 may have disposed on a first surface 78 conventional electrical bumps (or stud bumps) 86 and electrical traces (not shown) for electrically connecting the optical array 44 to a signal processing device (not shown). The electrical attachment method is not limited to stud bumps but may include solder bumps or a similar method. In a preferred embodiment of the invention, stud bumps electrically attached the optical array 44 is to the substrate 58, and an optically transparent adhesive 76, or underfill, mechanically attaches the optical array 44 to the first surface 78 of the substrate 58. The details of the optically transparent underfill 76 will be described in further detail below.

Figure 4:
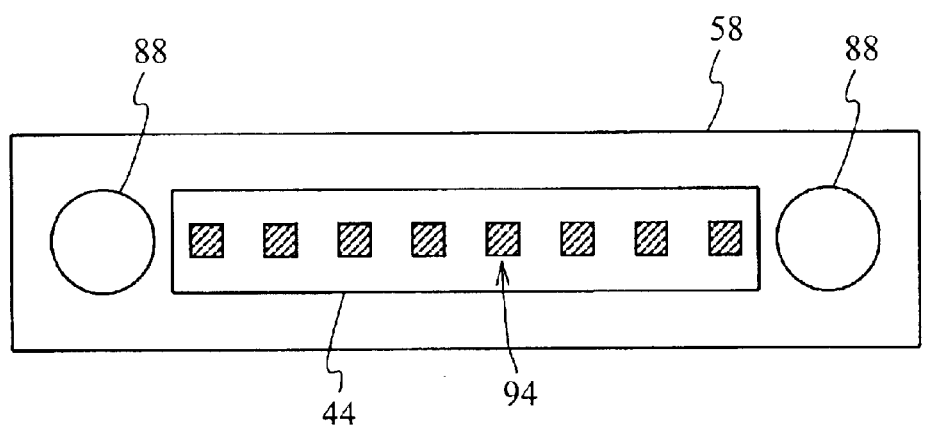
FIG. 4 is a top view of an optical array of attached to the substrate of FIG. 2.

It will be understood that the active optical array 44 can be any suitable photonic device or array of photonic devices including photo-transmitters, photo-receivers, or a combination thereof. A photo-transmitter can be any suitable device such as a vertical cavity surface emitting laser (VCSEL), light emitting diode (LED), or the like. Furthermore, any suitable photo-receiving device can be used, such as a photodiode, i.e., P-I-N diode, PN diode, or the like. Thus, the active optical array 44 can be a broad range of photoactive devices with transmitting and receiving capabilities. The optical array may have a number of optical ports 90, and each optical port 90 may be a photonics transmitter, receiver, or a combination transmitter/receiver, (FIG. 4 shows eight optical ports 90, yet the number of ports 90 is not limited to a specific value).

As shown in FIG. 3, the optically clear underfill may mechanically attach the optical array 44 to the substrate 58. The thickness of the underfill 76 may be 50–60 microns, or about the thickness of the stud bumps 86. In a preferred embodiment of the present invention, the underfill 76 is a conventional epoxy supplied by Epoxy Technology (commonly referred to as Epo-Tek). Yet, an addition epoxy displaying adequate optical and thermal properties could be used in the application. The optical signal's transmission paths 46 originating from the optical ports 90 may sequentially pass directly through the underfill 76 and the optically transparent substrate 58.

Also illustrated in FIG. 3 is a region of the optically clear underfill 76 that has been darkened, 94. As light emits from the optical port 90 in direction 46 shown, the darkened region 94 may absorb a portion of light. The darkened region 94 may then attenuate an optical signal as desired.

Details of the darkened region 94 will now be described in further detail. In a preferred embodiment of the invention, the darkened region 94 may be formed in the underfill 76 after the underfill 76 has cured. Thus, relative movement between the optical array 44 and the substrate 58 may be minimized when the darkened region 94 is being formed. This way, the darkened region 94 is formed at a precise location with respect to the transmission paths 46 of the optical array 44.

The darkened region 94 of the underfill 76 may be formed by using a conventional recognition module 110 comprising a photodetector 112 and a laser 114. The recognition module 110 may include software adapted to recognize and position itself in the line of the transmission path 46 of the optical signal from an optical port 90. Once recognition of the optical signal has occurred, the photodetector 112 may measure the light output from the optical port 90 and compare it with a nominal output programmed into a computing system. Upon reading the optical power output, the optical signal from the optical port 90 is disabled, and the laser 114 may be positioned in the line of the transmission path 46 of the optical signal.

The laser 114 is activated, and its output energy may be concentrated on a precise area of the optically clear underfill 76. When exposed to a specific amount of energy for a precise amount of time, the underfill 76 may darken accordingly. Essentially, the underfill 76 may over-cure and darken when exposed to energy from the laser 114. The amount of darkening desired coincides with the deviation of optical power output of the port 90 from the nominal output, (i.e., an optical output that is substantially higher than the nominal output may receive greater underfill darkening 94 along its transmission path 46).

The laser 114 used to darken the underfill 76 may be an excimer laser capable of emitting a controlled energy density. Similar lasers could be used to treat the underfill as appropriate.

Shown in FIG. 4 is a front view of a portion of the second surface 80 of the optically transparent substrate 58. Shown through the substrate are the plurality of darkened regions 94 as described above. In a preferred embodiment of the invention, one darkened region 94 exists for each optical port 90. Accordingly, each darkened region 94 could be fine tuned according to the output of each optical port 90 such that a desired optical energy is transmitted into an optical fiber 72. That is, for each optical port 90, the darkened region may be darkened to a specific amount as desired to reduce output energy to an appropriate level. Thus, the optical energy entering each optical fiber 72 could substantially be the same based on the level of darkening in each region.

In an alternate embodiment of the invention, a larger portion of the optically transparent underfill 76 could be darkened, such that all of the optical signals 46 of the optical array 44 pass substantially through the one darkened region. Using one darkening region has the advantage of less manufacturing time, but it does not allow a unique attenuation for each optical signal from each optical port.

Also shown in FIG. 4 is a set of apertures 88 formed in the transparent substrate 58 for receiving a set of alignment guide pins 64. The apertures 88 may properly align the optical port 90 of the optical array 44 to the optical fibers 72 of the optical connector assembly 54, as shown in FIG. 2.

The alignment pins 64, held in place by a pin holder assembly 50 shown in FIG. 2, are concurrently inserted through the apertures 88 in the substrate 58, and then through a corresponding set of apertures 70 formed on a first surface 74 of the plug 62. This is turn collinearly aligns the optical port 90 of the optical array 44 to the respective optical fibers 72 of the optical connector assembly 54.

The pin holder assembly 50 may generally comprise a pin holder block 56 and a plurality of guide pins 64. The pin holder block may be fabricated by a conventional machining or casting process, out of a suitable material having desirable thermal conductivity and thermal expansion properties. Materials found to exhibit such characteristics include but are not limited to stainless steel and molybdenum. The guide pins may in turn be glued or press fit into the pin holder block 56.

Figure 5:
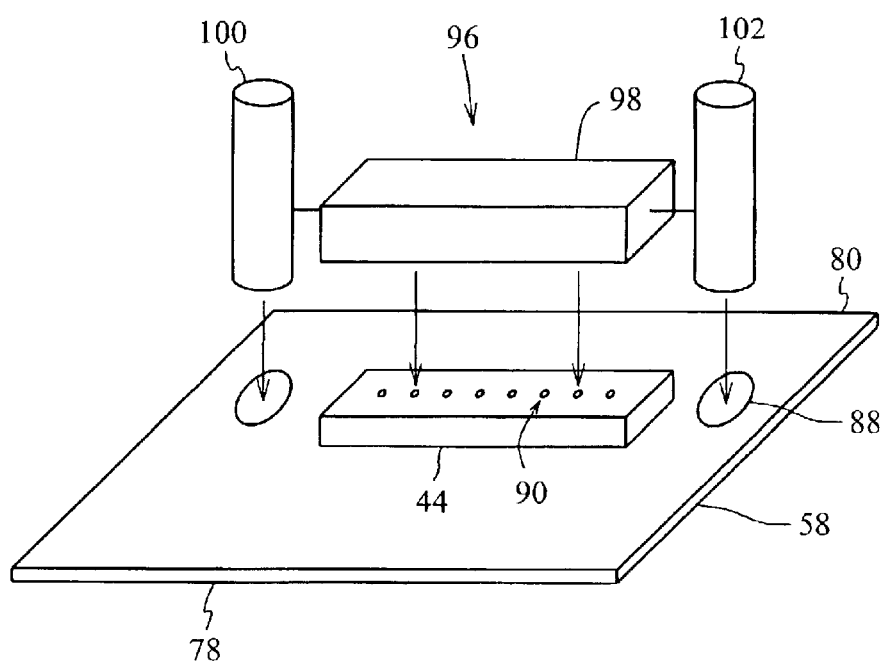
FIG. 5 is a profile view of the substrate of FIG. 2 and a pattern recognition system.

To form the alignment apertures 88 in the substrate 58 for receiving the alignment guide pins 64, a boring fixture 96 may be used (FIG. 5). The boring fixture 96 may include a pattern recognition module 98 and lasers 100, 102. The pattern recognition module 98 may include software adapted to recognize and position itself over a line of targets (not shown).

Once recognition of targets has occurred, the pattern recognition module 98 functions to identify a transverse line passing through the line of targets as well as a center point of the line of targets. The pattern recognition module 98 then positions its own transverse line and center point with the identified transverse line and center point. The lasers 100, 102 may be precisely aligned along the transverse line of the pattern recognition module 98. The lasers 100, 102 are also positioned a precise distance on either side of the center point of the pattern recognition module 98.

The pattern recognition module 98 may be programmed to view the array 44 through the transparent substrate 58 and identify the set of alignment targets (e.g., the alignment targets on opposing ends of the array 44). Once the pattern recognition module 98 has aligned itself with the recognition targets (and also the lasers 100, 102 on either side of the targets), the boring fixture 96 activates the lasers 100, 102 to ablate the holes 88 in precise alignment with the port 90.

A specific embodiment of a method and apparatus for attenuating an optical signal used in communications devices has been described for the purpose of illustrating the manner in which the invention is made and used. It should be understood that the implementation of other variations and modifications of the invention and its various aspects will be apparent to one skilled in the art, and that the invention is not limited by the specific embodiments described. Therefore, it is contemplated to cover the present invention and any and all modifications, variations, or equivalents that fall within the true spirit and scope of the basic underlying principles disclosed and claimed herein.

What is claimed is:

1. A method of transmitting an optical communications signal, such method comprising the steps of:
    securing an optical device onto an optically transparent substrate with an optically transparent adhesive such that an axis of transmission of the optical device passes directly through the optically transparent adhesive and a portion of the body of the optically transparent substrate and not through an electrode of the optical device;
    darkening a portion of the optically transparent adhesive with a laser; and
    transmitting light from the optical device through the darkened portion of the optically transparent adhesive such that at least some of the light from the optical device is absorbed by the darkened portion.

2. The method of transmitting an optical communications signal as in claim 1, further comprising defining the optical device as a solid state laser.

3. The method of transmitting an optical communications signal as in claim 2 further comprising defining the optically transparent adhesive as an optically clear underfill.

4. The method of transmitting an optical communications signal as in claim 3 wherein the step of darkening a portion of the optically transparent adhesive with a laser further comprises measuring the optical power output of the optical device for determining the deviation in optical power output from the nominal.

5. The method of transmitting an optical communications signal as in claim 4 wherein the step of darkening a portion of the optically transparent adhesive with a laser further comprises exposing the optically clear underfill to optical energy from an excimer laser such that the underfill darkens.

6. The method of transmitting an optical communications signal as in claim 5 wherein the step of darkening a portion of the optically transparent adhesive with a laser further comprises darkening the underfill to the extent that some optical energy of the optical signal is attenuated by the darkened region in the underfill and a nominal amount of optical energy of the optical signal passes through the optically transparent substrate.

7. An apparatus for transmitting an optical communications signal, comprising:
    an optical device secured to an optically transparent substrate with an optically transparent adhesive such that an axis of transmission of the optical device passes directly through the optically transparent adhesive and a portion of the body of the optically transparent substrate and not through any transparent electrode disposed on or in the transparent substrate and wherein
    a portion of the optically transparent adhesive has been darkened with a laser, such that an optical signal passing substantially through the darkened portion of the optically transparent adhesive is attenuated.

8. The apparatus for transmitting an optical communications signal as in claim 7 wherein the optical device further comprises a solid-state laser.

9. The apparatus for transmitting an optical communications signal as in claim 8 wherein the optically transparent adhesive further comprises as an optically clear underfill.

10. The apparatus for transmitting an optical communications signal as in claim 9 further comprising a photodetector for measuring the optical power output of the optical device to determine the deviation in optical power output from a nominal output for the optical device.

11. The apparatus for transmitting an optical communications signal as in claim 10 further comprising exposing the optically clear underfill to optical energy from an excimer laser such that the underfill darkens.

12. The apparatus for transmitting an optical communications signal as in claim 11 wherein the darkened underfill attenuates some of the optical energy of the optical signal and a nominal amount of optical energy passes through the optically transparent substrate.

* * * * *